(12) United States Patent
Tsai et al.

(10) Patent No.: US 8,581,399 B2
(45) Date of Patent: Nov. 12, 2013

(54) METAL BUMP STRUCTURE

(75) Inventors: Tsung-Fu Tsai, Changhua (TW);
Min-Feng Ku, Hsinchu (TW);
Yian-Liang Kuo, Toufen Township (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 59 days.

(21) Appl. No.: 13/192,826

(22) Filed: Jul. 28, 2011

(65) Prior Publication Data
US 2013/0026621 A1 Jan. 31, 2013

(51) Int. Cl.
*H01L 23/485* (2006.01)

(52) U.S. Cl.
USPC .......................................... 257/737

(58) Field of Classification Search
CPC .................................... H01L 23/485
USPC ........................... 257/737, E23.021
See application file for complete search history.

(56) References Cited

U.S. PATENT DOCUMENTS

| | | | |
|---|---|---|---|
| 7,459,386 B2* | 12/2008 | Tseng et al. | 438/613 |
| 7,919,860 B2* | 4/2011 | Murugan et al. | 257/737 |
| 2004/0180296 A1* | 9/2004 | Chen et al. | 430/315 |
| 2011/0089560 A1* | 4/2011 | Kuo et al. | 257/737 |

* cited by examiner

*Primary Examiner* — Walter H Swanson
(74) *Attorney, Agent, or Firm* — Lowe Hauptman & Ham, LLP (57) ABSTRACT

A semiconductor device comprises a substrate comprising a major surface and a plurality of metal bumps on the major surface. Each of the plurality of metal bumps comprises a metal via on the major surface and a metal pillar on the metal via having an overlay offset between the metal pillar and metal via. A first metal bump of the metal bumps has a first overlay offset and a second metal bump of the metal bumps farther than the first metal bump to a centroid of the substrate has a second overlay offset greater than the first overlay offset.

19 Claims, 13 Drawing Sheets

METAL BUMP STRUCTURE

FIELD

The disclosure relates to integrated circuit fabrication and, more particularly, to a semiconductor device with a metal bump structure.

BACKGROUND

Modern integrated circuits (ICs) are made up of literally millions of active devices, such as diodes and transistors, and passive devices, such as inductors, capacitors and resistors. To increase manufacturing throughput and lower manufacturing costs, the ICs are manufactured in semiconductor wafers, each containing many identical semiconductor chips. After the ICs are manufactured, semiconductor chips are sawed from the wafers and packaged before they can be used.

In some packaging processes, semiconductor chips (also referred to as dies) are first attached to package substrates. This includes physically securing the semiconductor chips on the package substrates and connecting bonding pads on the semiconductor chips to bonding pads on the package substrates. Underfill, which comprises epoxy, is used to further secure the bonding. The semiconductor chips may be bonded using either flip-chip bonding or wire bonding. Flip-chip bonding utilizes metal bumps to establish electrical contact between a chip's contact pads and the package substrate.

However, there are challenges to implementing such features and processes in IC fabrication. For example, delamination may occur between inter-metal dielectric (IMD) layers overlying the ICs due to high stress from a metal bump, thereby increasing the likelihood of an open circuit.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DESCRIPTION

It is understood that the following disclosure provides many different embodiments, or examples, for implementing some features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Various features may be arbitrarily drawn in different scales for simplicity and clarity.

Figure 1:
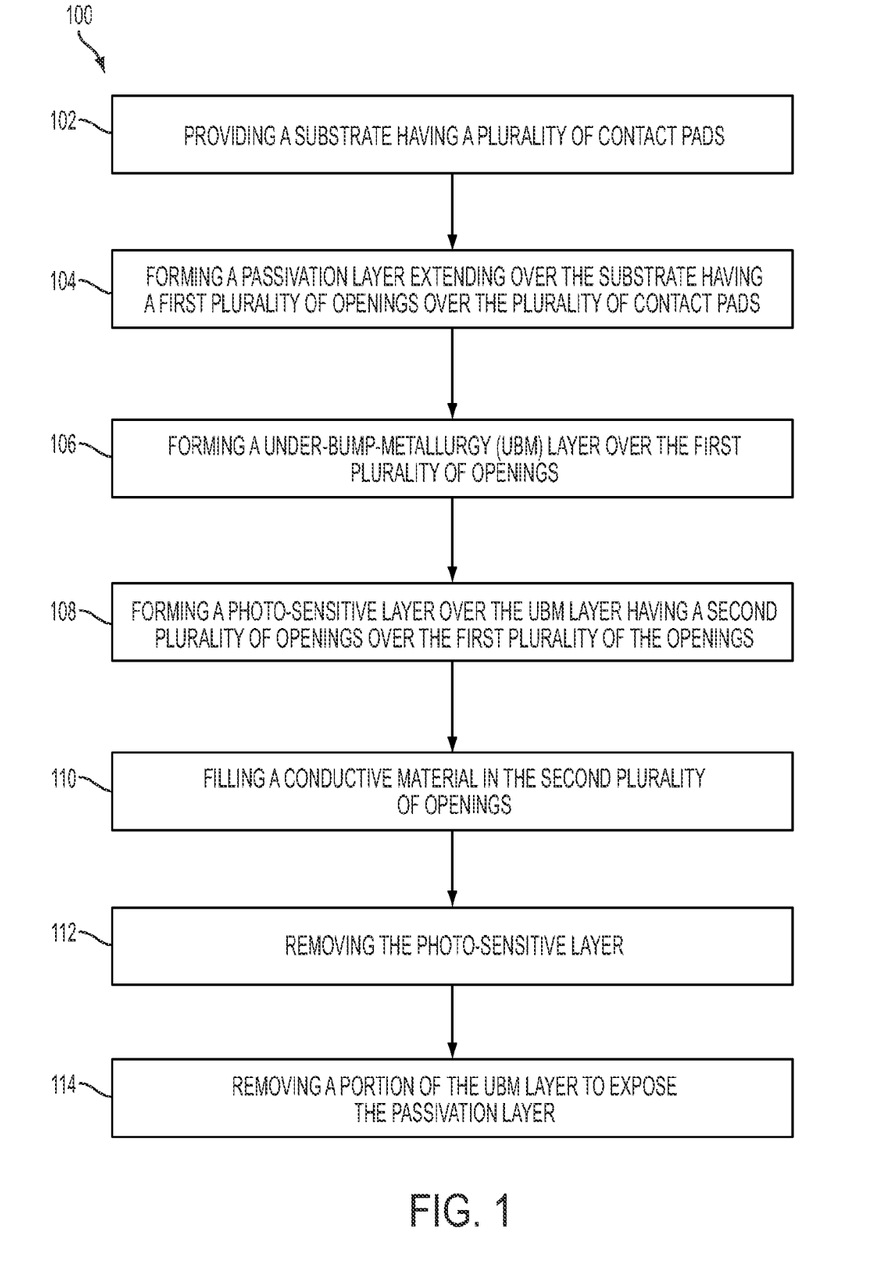
FIG. 1 is a flowchart of a method of fabricating a semiconductor device comprising a plurality of metal bumps according to various aspects of the present disclosure.

FIG. 1 is a flowchart of a method 100 of fabricating a semiconductor device 200 (FIG. 8) comprising a plurality of metal bumps 220 (shown in FIG. 8) according to various aspects of the present disclosure. FIGS. 2-8 are schematic cross-sectional views of semiconductor device 200 having the plurality of metal bumps 220 at various stages of fabrication according to various aspects of the present disclosure. The method of FIG. 1 does not produce a completed semiconductor device. Accordingly, it is understood that additional processes may be provided before, during, and/or after the method 100 of FIG. 1, and that some other processes may only be briefly described herein. Also, FIGS. 1 through 8 are simplified for a better understanding of the concepts of the present disclosure. For example, although the figures illustrate the plurality of metal bumps 220 of semiconductor device 200, it is understood the semiconductor device 200 may be part of an integrated circuit (IC) package that further comprises a number of other components such as under-fill, lead-frame, etc.

Figure 2:
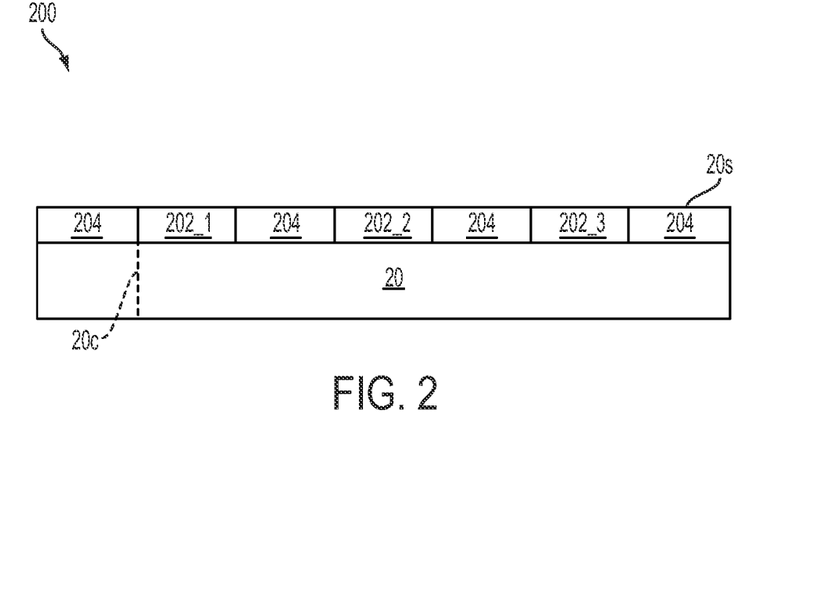
FIGS. 2-7, 7A and 8 are schematic cross-sectional views of a semiconductor device having a plurality of metal bumps at various stages of fabrication according to various aspects of the present disclosure.

Referring to FIGS. 1 and 2, the method 100 begins at step 102 wherein a substrate 20 comprising a major surface 20s is provided. The substrate 20 may comprise a silicon substrate. The substrate 20 may alternatively comprise silicon germanium, gallium arsenic, or other suitable semiconductor materials. The substrate 20 may further comprise other features such as various doped regions, a buried layer, and/or an epitaxy layer. Furthermore, the substrate 20 may be a semiconductor on insulator such as silicon on insulator (SOI) or silicon on sapphire. In other embodiments, the substrate 20 may comprise a doped epi layer, a gradient semiconductor layer, and/or may further include a semiconductor layer overlying another semiconductor layer of a different type such as a silicon layer on a silicon germanium layer. In other examples, a compound semiconductor substrate 20 may comprise a multilayer silicon structure or a silicon substrate may include a multilayer compound semiconductor structure.

The substrate 20 further comprises a plurality of isolation regions (not shown). The isolation regions may utilize isolation technology, such as local oxidation of silicon (LOCOS) or shallow trench isolation (STI), to define and electrically isolate the various microelectronic elements (not shown). In the present embodiment, the isolation regions include a STI. The isolation regions may comprise silicon oxide, silicon nitride, silicon oxynitride, fluoride-doped silicate glass (FSG), a low-K dielectric material, other suitable materials, and/or combinations thereof. The isolation regions, and in the present embodiment, the STI, may be formed by any suitable process. As one example, the formation of the STI may include patterning the semiconductor substrate 20 by a photolithography process, etching a trench in the substrate 20 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Examples of the various microelectronic elements that may be formed in the substrate 20 include transistors (e.g., p-channel/n-channel metal oxide semiconductor field effect transistors (pMOSFETs/nMOSFETs), bipolar junction transistors (BJTs), high voltage transistor, high frequency transistor, etc.); diodes; resistors; capacitors; inductors; fuses; and/or other suitable elements. Various processes are performed to form the various microelectronic elements including deposition, photolithography, implantation, etching, annealing, and/or other suitable processes. The microelectronic elements are interconnected to form the IC device, such as a logic device, memory device (e.g., static random access memory or SRAM), radio frequency (RF) device, input/output (I/O) device, system-on-chip (SoC) device, combinations thereof, and/or other suitable types of devices.

The substrate 20 further comprises inter-layer dielectric (ILD) layers, inter-metal dielectric (IMD) layers and an interconnect structure overlying the ICs (not shown). The IMD layers in the interconnect structure include low dielectric constant (low-k) dielectric materials, un-doped silicate glass (USG), fluorine-doped silicate glass (FSG), carbon-doped silicate glass, silicon nitride, silicon oxynitride, or other commonly used materials. The dielectric constants of the low-k dielectric materials may be less than about 3.9, or less than about 2.3. Metal lines in the interconnect structure may be formed of copper or copper alloys. One skilled in the art will appreciate the formation details of the interconnect structure.

A plurality of contact pads 202 is (i.e., 202_1, 202_2, and 202_3) formed in a top interconnect layer positioned in a top-level IMD layer 204, which is a portion of conductive routes and has an exposed surface treated by a planarization process, such as chemical mechanical polishing (CMP), if necessary. In the present embodiment, the plurality of contact pads 202 may comprise a first contact pad 202_1 adjacent to a centroid 20c of the substrate 20, a third contact pad 202_3 offset from the centroid 20c of the substrate 20, and a second contact pad 202_2 interposed between the first contact pad 202_1 and third contact pad 202_3. Suitable materials for the plurality of contact pads 202 may comprise, but are not limited to, for example Cu, Al, AlCu, Al alloy, Cu alloy, or other conductive materials. The plurality of contact pads 202 is used in the bonding process to connect the integrated circuits in the respective chip to external features.

Then, a plurality of metal bumps is formed over the plurality of contact pads 202 to establish an electrical and mechanical connection to conductive bumps on a package substrate to form a package assembly. It should be noted that the plurality of metal bumps over the contact pad 202 provides enough mechanical strength and low resistance for flip-chip bonding, but may transmit high stress to an interface of the IMD layers if the bumps have been reflowed with a ramp-down step, resulting in delamination between the IMD layers, thereby increasing the likelihood of an open circuit.

Accordingly, the processing discussed below with reference to FIGS. 2-8 may use overlay offset between a metal via and a metal pillar to provide enough mechanical strength and lower resistance for flip-chip bonding, but transmit low stress to an interface of the IMD layers, problems associated with high stress from metal bumps between the IMD layers may be avoided. This can reduce delamination between the IMD layers and enhance device performance.

Figure 3:
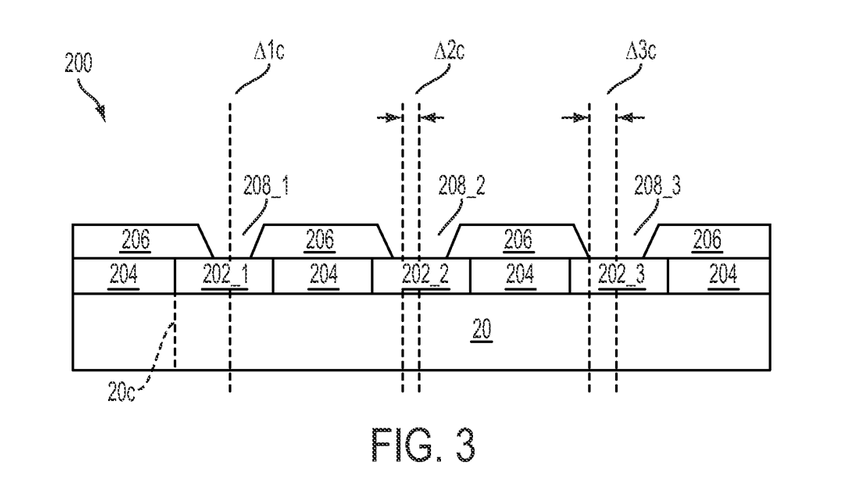

The method 100 in FIG. 1 continues with step 104 in which the structure in FIG. 3 is produced by forming a passivation layer 206 extending over the substrate 20 having a first plurality of openings 208 (denoted as 208_1, 208_2, and 208_3) over the plurality of contact pads 202. The passivation layer 206 is formed overlying and exposing a portion of the contact pads 202 for defining a window of the metal via 220a (shown in FIG. 8) to allow subsequent metal bump processes.

The passivation layer 206 is formed of a non-organic material comprising un-doped silicate glass (USG), silicon nitride, silicon oxynitride, silicon oxide, or combinations thereof. Alternatively, the passivation layer is formed of a polymer layer, such as an epoxy, polyimide, benzocyclobutene (BCB), polybenzoxazole (PBO), or the like, although other relatively soft, often organic, dielectric materials can also be used. In at least one embodiment, the passivation layer 206 may be formed using a chemical vapor deposition (CVD), high-density-plasma CVD (HDP CVD), sub-atmospheric CVD (SACVD), physical vapor deposition (PVD), or spin-on process.

Then, a layer of photoresist (not shown) is formed over the passivation layer 206 by a suitable process, such as spin-on coating, and patterned to form a patterned photoresist feature by a proper lithography patterning method. In the present embodiment, each opening 208 to be formed may have an overlay offset to the corresponding contact pads 202. Throughout the drawings, the overlay offsets between two features are measured from the centroids of the two features. Accordingly, in the exposure of the photoresist, an overlay offset is applied to the exposure step. The patterned photoresist feature can then be transferred using a dry etching process to the passivation layer 206 to form the plurality of openings 208. The photoresist layer may be stripped thereafter.

In at least one embodiment, the overlay offset increases as the distance from the centroid 20c of the substrate 20 increases, that is, an overlay offset $\Delta_{1C}$ between the first opening 208_1 and first contact pad 202_1 adjacent to the centroid 20c of the substrate 20 is less than an overlay offset $\Delta_{2C}$ between the second opening 208_2 and second contact pad 202_2 farther to the centroid 20c of the substrate 20. Further, the overlay offset $\Delta_{2C}$ is less than an overlay offset $\Delta_{3C}$ between the third opening 208_3 and third contact pad 202_3, which is even farther to the centroid 20c of the substrate 20 as compared to the former.

Figure 4:
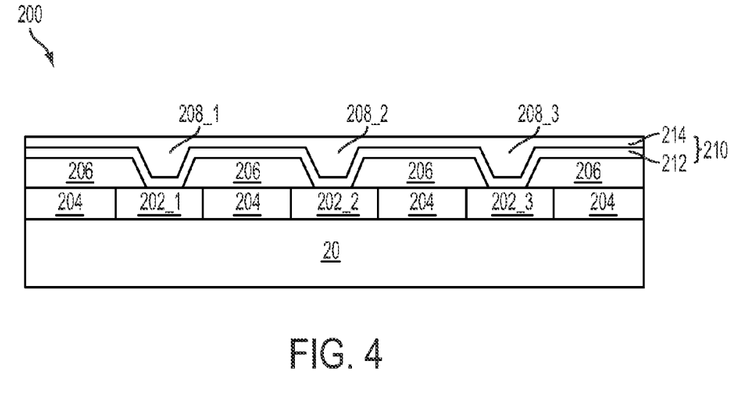

The method 100 in FIG. 1 continues with step 106 in which the structure in FIG. 4 is produced by forming an under-bump-metallurgy (UBM) layer 210 over the first plurality of openings 208. In at least one embodiment, the UBM layer 210 comprises a barrier layer 212 and a seed layer 214 over the barrier layer 212. The barrier layer 212 extends into the openings 208 in the passivation layer 206 and is electrically coupled to, and may be in physical contact with, the contact pads 202. The barrier layer 212 may be a titanium layer, a titanium nitride layer, a tantalum layer, or a tantalum nitride layer, or layers formed of a titanium alloy or a tantalum alloy. The materials of the seed layer 214 may include copper or copper alloys, and hence the seed layer 214 is alternatively referred to as a copper seed layer hereinafter. However, other metals such as silver, gold, aluminum, palladium, nickel, nickel alloys, tungsten alloys, chromium, chromium alloys, and/or combinations thereof may also be included. In at least one embodiment, the barrier layer 212 and seed layer 214 are formed using physical vapor deposition (PVD), sputtering, or other applicable methods. The barrier layer 212 may have a thickness ranging from about 500 Å to about 2,000 Å. The seed layer 214 may have a thickness ranging from about 1,000 Å to about 10,000 Å, although different thicknesses may be used.

Figure 5:
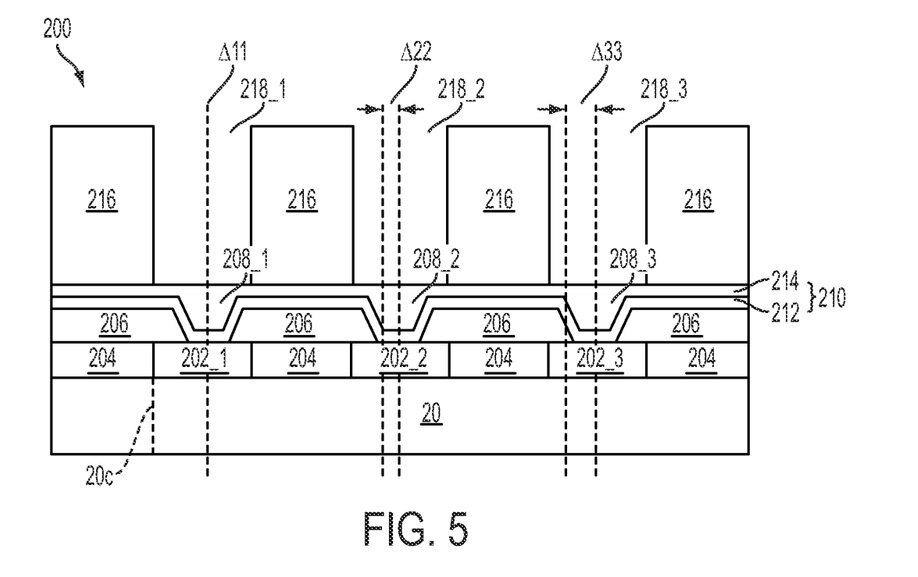

The method 100 in FIG. 1 continues with step 108 in which the structure in FIG. 5 is produced by forming a photosensitive layer 216 over the UBM layer 210 having a second plurality of openings 218 (donated as 218_1, 218_2, and 218_3) over the first plurality of openings 208, overlying the plurality of contact pads 202, and exposing a portion of the UBM layer 210 for defining a window of the metal pillar 220b (shown in FIG. 8) to allow subsequent metal bump processes.

The photo-sensitive layer 216 is applied over the UBM layer 210 by deposition processes known to the applicants. The photo-sensitive layer 216 may be a dry film or a photo-resist film. In at least one embodiment, the photo-sensitive layer 216 is formed by laminating a dry film over the UBM layer 210 having a thickness of from about 20 μm to about 30 μm. In another embodiment, the photo-sensitive layer 216 is formed by spin-coating a photo-resist film over the UBM layer 210 to obtain a thickness of from about 20 μm to about 30 μm. It is understood that the thickness of the photo-sensitive layer 216 can be controlled and selected to be a predetermined value, this especially in relation to the thickness of the column of a to-be-formed metal bump material.

In order to form the overlay offset between the metal via 220a and metal pillar 220b (shown in FIG. 8), each opening 218 for the metal pillar 220b to be formed has an overlay offset to the corresponding opening 208 for the metal via 220a to be formed. Accordingly, in the exposure of the photo-sensitive layer 216, an overlay offset is applied to the exposure step. The patterned photo-sensitive feature can then be transferred using a plating process to fill the openings 218.

In at least one embodiment, the overlay offset increases as the distance from the centroid 20c of the substrate 20 increases, that is, an overlay offset $\Delta_{11}$ between the first opening 208_1 and first opening 218_1 adjacent to the centroid 20c of the substrate 20 is less than an overlay offset $\Delta_{22}$ between the second opening 208_2 and second opening 218_2 farther to the centroid 20c of the substrate 20. Further, the overlay offset $\Delta_{22}$ is less than an overlay offset $\Delta_{33}$ between the third opening 208_3 and third opening 218_3, which is even farther to the centroid 20c of the substrate 20 as compared to the former.

In at least one embodiment, each opening 218 may comprise vertical sidewalls where the photo-sensitive layer 216 meets the UBM layer 210. In another embodiment, a tapered structure (not shown) is formed by under-exposing or under-developing the photo-sensitive layer 216, thereby each opening 218 comprises tapers inward so that there is an acute contact angle where the photo-sensitive layer 216 meets the UBM layer 210, resulting in later-formed metal pillars with tapered sidewalls as shown in FIG. 7A.

Figure 6:
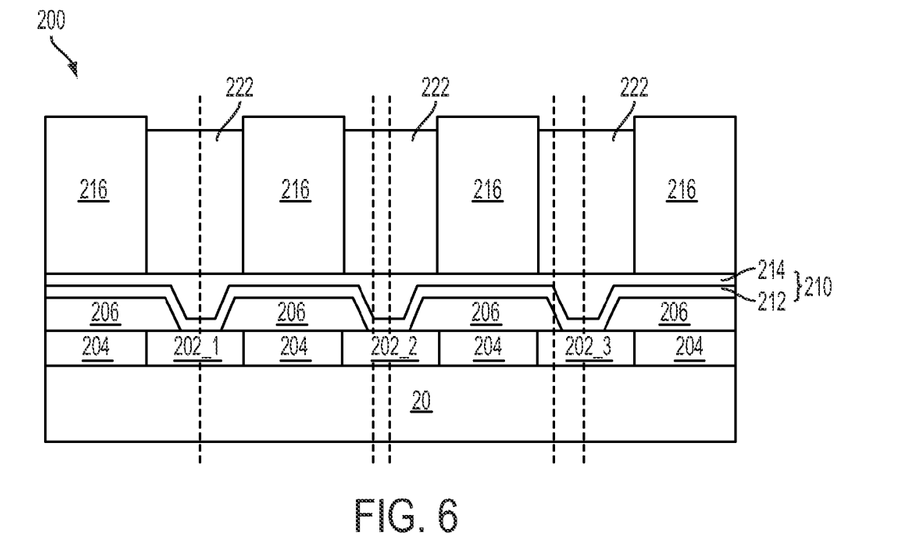

The method 100 in FIG. 1 continues with step 110 in which the structure in FIG. 6 is produced by filling a conductive material 222 in the openings 218. In the present embodiment, the openings 218 are partially or fully filled with the conductive material 222 by suitable formations methods. In the present embodiment, the conductive material 222 is formed upward along the openings 218 from the seed layer 214.

In at least one embodiment, the conductive material 222 comprises a copper-containing material, the copper-containing material refers to substantially a layer including pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium. In some alternative embodiments, the conductive material 222 comprises a solder material. The solder material may be made of Sn, SnAg, Sn—Pb, SnAgCu (with Cu weight percentage less than 0.5%), SnAgZn, SnZn, SnBi—In, Sn—In, Sn—Au, SnPb, SnCu (with Cu weight percentage less than 0.7%), SnZnIn, or SnAgSb, etc. In some embodiments, the conductive material 222 and the seed layer 214 may be formed from the same material.

The formation methods of filling the conductive material 222 may include sputtering, printing, electro plating, electroless plating, and/or chemical vapor deposition (CVD) methods. For example, electro-chemical plating (ECP) is carried out to form the conductive material 222. In an exemplary embodiment, a thickness of the conductive material 222 is greater than 20 μm. For example, the conductive material 222 is of about 20-30 μm in thickness, although the thickness may be greater or smaller.

Figure 7:
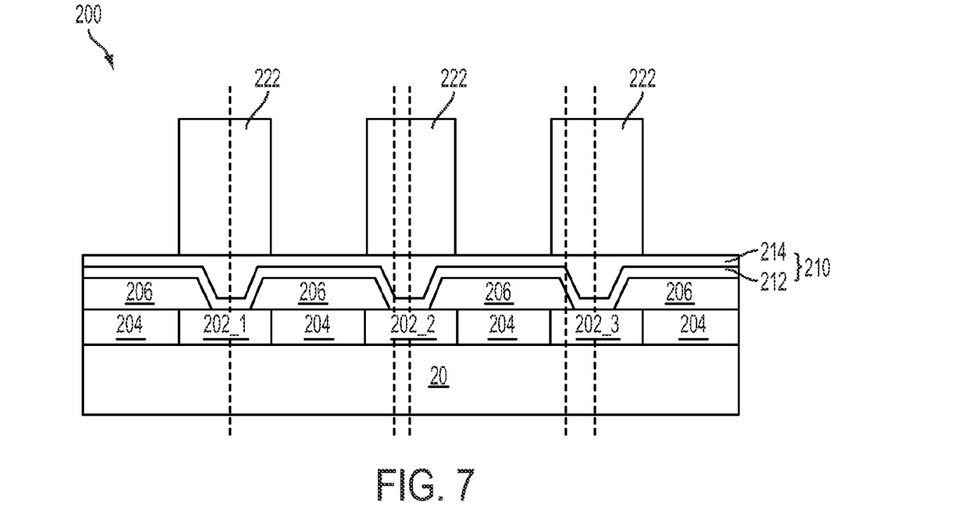
Figure 7A:
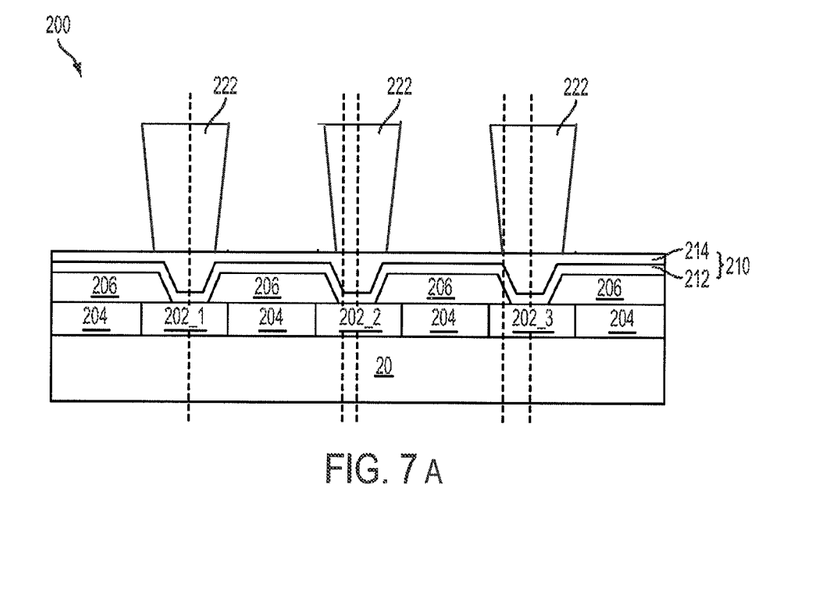

The method 100 in FIG. 1 continues with step 112 in which the structure in FIG. 7 is produced by removing the photo-sensitive layer 216. In the present embodiment, the photo-sensitive layer 216 may be removed using wet etching or dry etching processes. Then, step 114 (FIG. 1) is performed to form the structure depicted in FIG. 8 in which reference numeral 205 denotes an interface between the top-level IMD layer 204 and the passivation layer 206. Using the conductive material 222 as a hard-mask, a portion of the UBM layer 210 is removed to expose the passivation layer 206. The step of removing a portion of the UBM layer 210 is performed using a wet etching process. For example, the wet etching process for UBM removal comprises removing a portion of the UBM layer 210 in a solution comprising $H_3PO_3$ and $H_2O_2$.

Figure 8:
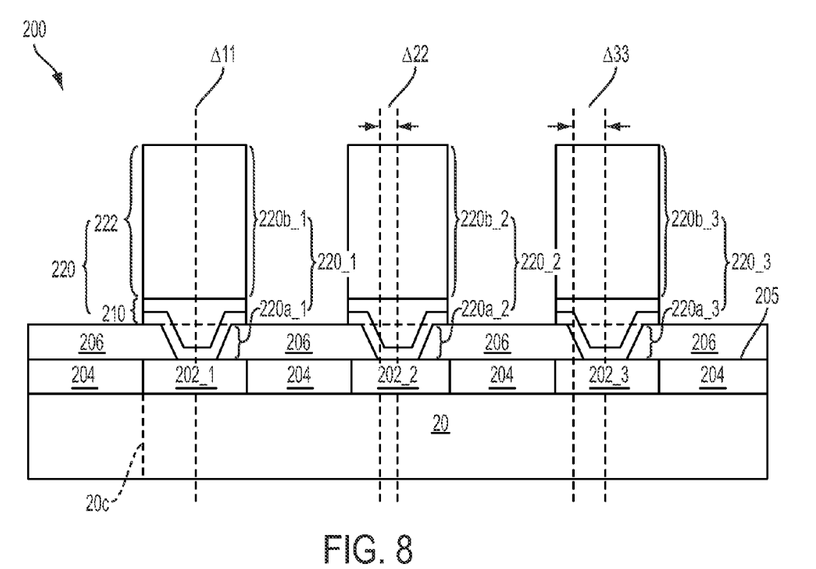

In the present embodiment, the UBM layer 210 may be removed until outer edges of the remaining UBM layer 210 is substantially aligned with outer edges of the conductive material 222. It should be noted that, in some embodiments, additional etching is not preferable due to increased contact resistance, resulting from the reduced contact area between the remaining UBM layer 210 and conductive material 222. Structurally, the remaining UBM layer 210 and conductive material 222 are combined and referred to as a plurality of metal bumps 220 (denoted as 220_1, 220_2, and 220_3). In the present embodiment, each of the plurality of the metal bump 220 comprises a metal via 220a on the major surface 20s and a metal pillar 220b on the metal via 220a having an overlay offset between the metal pillar 220b and metal via 220a. In at least one embodiment, the metal pillar 220b comprises a copper-containing pillar. In some alternative embodiments, the metal pillar 220b comprises solder bump. In at least one embodiment, the metal pillar 220b comprises substantially vertical sidewalls. In some alternative embodiments, the metal pillar 220b comprises tapered sidewalls.

It the present embodiment, the first plurality of openings 208 is filled with the metal via 220a and the second plurality of openings 218 is filled with the metal pillar 220b. Accordingly, the overlay offset between the metal pillar 220b and metal via 220a is substantially equal to the overlay offset between the first opening 208 and second opening 218. Thus, the overlay offset between the metal pillar 220b and metal via 220a also increases as the distance from the centroid 20c of the substrate 20 increases, that is, the overlay offset $\Delta_{11}$ between the first metal pillar 220b_1 and first metal via 220a_1 adjacent to the centroid 20c of the substrate 20 is less than the overlay offset $\Delta_{22}$ between the second metal pillar 220b_2 and second metal via 220a_2 farther to the centroid 20c of the substrate 20. In other words, the first metal bump 220_1 has the first overlay offset $\Delta_{11}$ and a second metal bump 220_2 farther than the first metal bump 220_1 to the centroid 20c of the substrate 20 has the second overlay offset $\Delta_{22}$ greater than the first overlay offset $\Delta_{11}$. In at least one embodiment, the first overlay offset $\Delta_{11}$ may be equal to or greater than 0 μm. Further, the overlay offset $\Delta_{22}$ is less than the overlay offset $\Delta_{33}$ between the third metal pillar 220b_3 and third metal via 220a_3, which is even farther to the centroid 20c of the substrate 20 as compared to the former.

Figure 9:
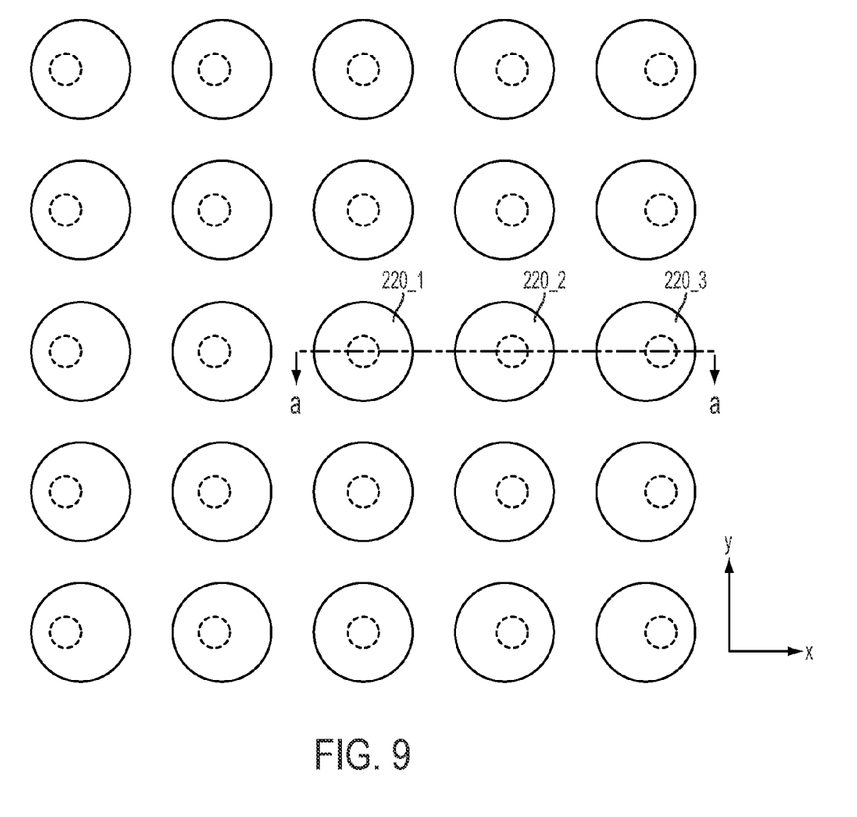
FIG. 9 is a top view of a plurality of metal bumps of a semiconductor device fabricated using the steps shown in FIGS. 1-8 in accordance with an embodiment.

A top view of a plurality of metal bumps 220 of a semiconductor device 200 fabricated using the steps shown in FIGS. 1-8 is illustrated in FIG. 9. To illustrate the effect of the overlay offset, patterns shown with solid circles are the patterns of metal pillars 220b, while patterns shown with dotted circles are the patterns of metal vias 220a with the overlay offset applied to the patterns of metal pillars 220b. In the present embodiment, the overlay offset is a difference of metal pillar 220b and metal via 220a centroids along a predefined axis X or Y. The axes X and Y are defined according to the directions of alignment of the metal bumps 220. For example, in some embodiments, FIG. 8 is a representative schematic cross-sectional view of a plurality of metal bumps 220 taken along the line a-a of FIG. 9 parallel to the X axis. In some embodiments, a difference between the second overlay offset $\Delta_{22}$ and the first overlay offset $\Delta_{11}$ is from about 1 to 20 μm. In some embodiments, a difference between the third overlay offset $\Delta_{33}$ and the second overlay offset $\Delta_{22}$ is from about 1 to 20 μm. In some embodiments, a ratio of the second overlay offset $\Delta_{22}$ to the first overlay offset $\Delta_{11}$ is from about 1.05 to 2.5. In some embodiments, a ratio of the third overlay offset $\Delta_{33}$ to the second overlay offset $\Delta_{22}$ is from about 1.05 to 2.5.

Figure 10:
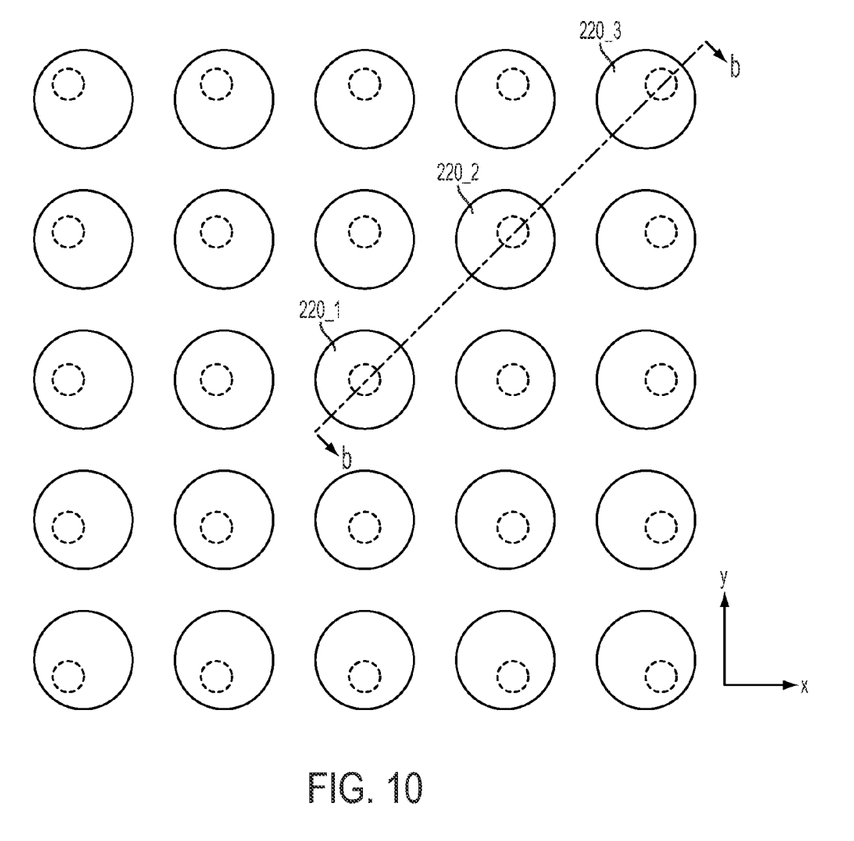
FIG. 10 is a top view of a plurality of metal bumps of a semiconductor device fabricated using the steps shown in FIGS. 1-8 in accordance with another embodiment.

FIG. 10 illustrates an alternative top view of a plurality of metal bumps 220 of a semiconductor device 200 fabricated using the steps shown in FIGS. 1-8, wherein instead of applying the overlay offset along an axis, the plurality of metal bumps 220 is formed with a two-dimensional overlay offset, which is applied to both X and Y directions of the substrate 20. In other words, the overlay offset is a difference of metal pillar 220b and metal via 220a centroids along a first axis (i.e., X-direction) and a second axis (i.e., Y-direction) orthogonal to the first axis. In an example, FIG. 8 is a representative schematic cross-sectional view of a plurality of metal bumps 220 taken along the line b-b of FIG. 10.

In some embodiments, a difference between the second overlay offset $\Delta_{22}$ and the first overlay offset $\Delta_{11}$ along the first axis is from about 1 to 20 μm. In some embodiments, a difference between the third overlay offset $\Delta_{33}$ and the second overlay offset $\Delta_{22}$ along the first axis is from about 1 to 20 μm. In some embodiments, a difference between the second overlay offset $\Delta_{22}$ and the first overlay offset $\Delta_{11}$ along the second axis is from about 1 to 20 μm. In some embodiments, a difference between the third overlay offset $\Delta_{33}$ and the second overlay offset $\Delta_{22}$ along the second axis is from about 1 to 20 μm.

In some embodiments, a ratio of the second overlay offset $\Delta_{22}$ to the first overlay offset $\Delta_{11}$ along the first axis is from about 1.05 to 2.5. In some embodiments, a ratio of the third overlay offset $\Delta_{33}$ to the second overlay offset $\Delta_{22}$ along the first axis is from about 1.05 to 2.5. In some embodiments, a ratio of the second overlay offset $\Delta_{22}$ to the first overlay offset $\Delta_{11}$ along the second axis is from about 1.05 to 2.5. In some embodiments, a ratio of the third overlay offset $\Delta_{33}$ to the second overlay offset $\Delta_{22}$ along the second axis is from about 1.05 to 2.5.

Figure 11:
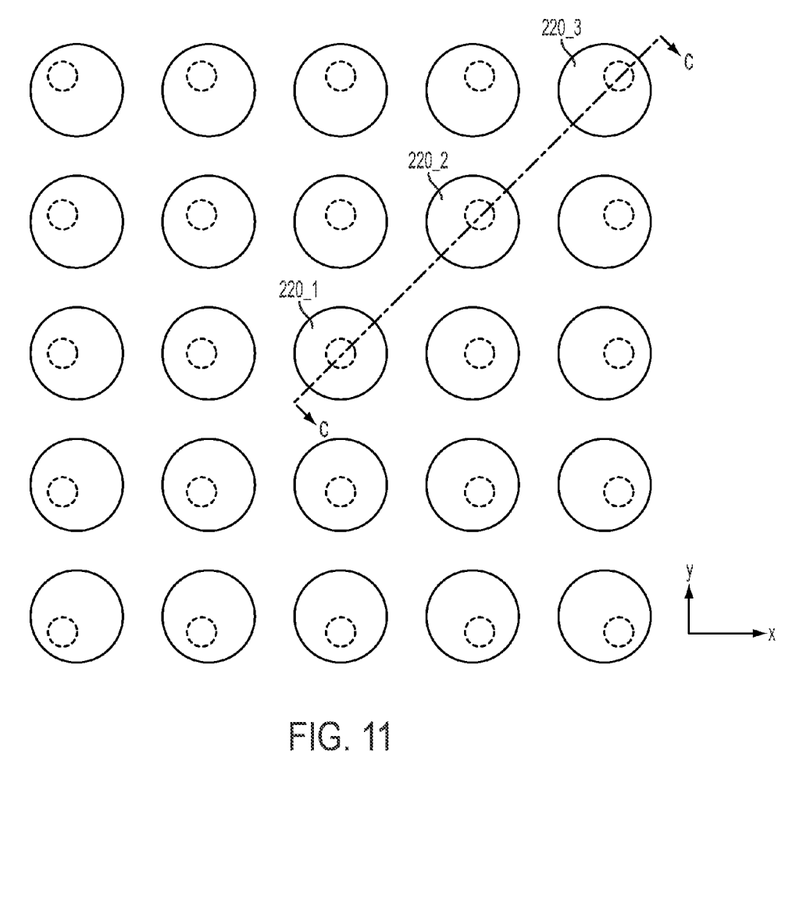
FIG. 11 is a top view of a plurality of metal bumps of a semiconductor device fabricated using the steps shown in FIGS. 1-8 in accordance with yet another embodiment.

FIG. 11 illustrates an alternative top view of a plurality of metal bumps 220 of a semiconductor device 200 fabricated using the steps shown in FIGS. 1-8, wherein the plurality of metal bumps 220 is formed with a two-dimensional overlay offset, which is applied to both X and Y directions of the substrate 20. In other words, the overlay offset is a difference of metal pillar 220b and metal via 220a centroids, and a component of the difference along a first axis (i.e., X-direction) and a component of the difference along a second axis (i.e., Y-direction) are not equal. In an example, FIG. 8 is a representative schematic cross-sectional view of a plurality of metal bumps 220 taken along the line c-c of FIG. 11.

In some embodiments, a difference between the second overlay offset $\Delta_{22}$ and the first overlay offset $\Delta_{11}$ along the first axis is from about 1 to 20 μm. In some embodiments, a difference between the third overlay offset $\Delta_{33}$ and the second overlay offset $\Delta_{22}$ along the first axis is from about 1 to 20 μm. In some embodiments, a difference between the second overlay offset $\Delta_{22}$ and the first overlay offset $\Delta_{11}$ along the second axis is from about 1 to 20 μm. In some embodiments, a difference between the third overlay offset $\Delta_{33}$ and the second overlay offset $\Delta_{22}$ along the second axis is from about 1 to 20 μm.

In some embodiments, a ratio of the second overlay offset $\Delta_{22}$ to the first overlay offset $\Delta_{11}$ along the first axis is from about 1.05 to 2.5. In some embodiments, a ratio of the third overlay offset $\Delta_{33}$ to the second overlay offset $\Delta_{22}$ along the first axis is from about 1.05 to 2.5. In some embodiments, a ratio of the second overlay offset $\Delta_{22}$ to the first overlay offset $\Delta_{11}$ along the second axis is from about 1.05 to 2.5. In some embodiments, a ratio of the third overlay offset $\Delta_{33}$ to the second overlay offset $\Delta_{22}$ along the second axis is from about 1.05 to 2.5.

Figure 12:
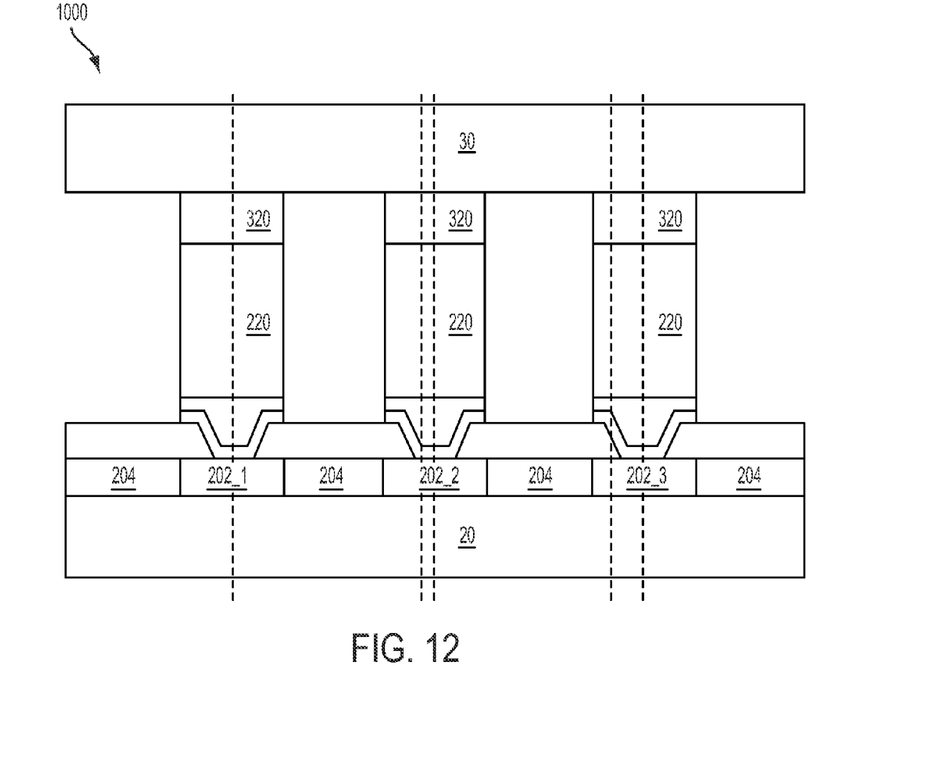
FIG. 12 is a cross-sectional view of a semiconductor device bonded to a package substrate according to various aspects of the present disclosure.

FIG. 12 is a cross-sectional view of a semiconductor device 200 bonded to a package substrate 30 to obtain a package 1000 according to various aspects of the present disclosure. With the overlay offset applied in the formation of the plurality of metal bumps 220, metal bumps 220 are aligned with respective ones of bumps 320 of package substrate 300. In some embodiments, the overlay offset is also applied in the formation of the plurality of metal bumps 320. In at least one embodiment, the substrate 20/30 is a semiconductor chip. In another embodiment, the substrate 20/30 is a package substrate.

Then, subsequent processes, including flip-chip processing, must be performed after forming the semiconductor device 200 to complete the IC fabrication.

In accordance with some embodiments, a semiconductor device comprises a substrate comprising a major surface and a plurality of metal bumps on the major surface. Each of the plurality of metal bumps has a metal via on the major surface and a metal pillar on the metal via having an overlay offset between the metal pillar and metal via. A first metal bump has a first overlay offset and a second metal bump farther than the first metal bump to a centroid of the substrate has a second overlay offset greater than the first overlay offset.

In accordance with other embodiments, a semiconductor device comprises a substrate comprising a major surface and a plurality of metal bumps on the major surface. Each of the plurality of metal bumps comprises a metal via on the major surface and a metal pillar on the metal via having an overlay offset between the metal pillar and metal via. A first metal bump has a first overlay offset and a second metal bump farther than the first metal bump to a centroid of the substrate has a second overlay offset greater than the first overlay offset, and the overlay offset is a difference of metal pillar and metal via centroids along an axis.

In accordance with yet other embodiments, a semiconductor device comprises a substrate comprising a major surface and a plurality of metal bumps on the major surface. Each of the plurality of metal bumps comprises a metal via on the major surface and a metal pillar on the metal via having an overlay offset between the metal pillar and metal via A first metal bump has a first overlay offset and a second metal bump farther than the first metal bump to a centroid of the substrate has a second overlay offset greater than the first overlay offset, and the overlay offset is a difference of metal pillar and metal via centroids along a first axis and a second axis orthogonal to the first axis.

In accordance with yet other embodiments, a semiconductor device comprises a substrate comprising a major surface and a plurality of metal bumps on the major surface. Each of the plurality of metal bumps comprises a metal via on the major surface and a metal pillar on the metal via having an overlay offset between the metal pillar and metal via. A first metal bump has a first overlay offset and a second metal bump farther than the first metal bump to a centroid of the substrate has a second overlay offset greater than the first overlay offset, and the overlay offset is a difference of metal pillar and metal via centroids. A component of the difference along a first axis and a component of the difference along a second axis are not equal.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
a substrate comprising a major surface; and
a plurality of metal bumps on the major surface, wherein each of the plurality of metal bumps comprises:
a metal via on the major surface, and
a metal pillar on the metal via, the metal pillar electrically connected to the metal via, each of the metal bumps of the plurality of metal bumps having an overlay offset between the metal pillar and the metal via, wherein the overlay offset is a distance between a centroid of the metal pillar and a centroid of the metal via,
wherein
the overlay offset of a first metal bump of the metal bumps is a first overlay offset,
the overlay offset of a second metal bump of the metal bumps is a second overlay offset,
the second metal bump is farther than the first metal bump to a centroid of the substrate,
the second overlay offset is greater than the first overlay offset, and
a difference between the second overlay offset and the first overlay offset ranges from about 1 to 20 μm.

2. The semiconductor device of claim 1, wherein a ratio of the second overlay offset to the first overlay offset ranges from about 1.05 to 2.5.

3. The semiconductor device of claim 1, wherein
the overlay offset between the metal pillar and the metal via is present along a first axis and a second axis orthogonal to the first axis, and
the plurality of metal bumps are arranged in a plurality of rows extending in the first axis and in a plurality of columns extending in the second axis.

4. The semiconductor device of claim 3, wherein a difference between the second overlay offset and the first overlay offset along the first axis ranges from about 1 to 20 μm.

5. The semiconductor device of claim 3, wherein a ratio of the second overlay offset to the first overlay offset along the first axis is from about 1.05 to 2.5.

6. The semiconductor device of claim 3, wherein a difference between the second overlay offset and the first overlay offset along the second axis is from about 1 to 20 μm.

7. The semiconductor device of claim 3, wherein a ratio of the second overlay offset to the first overlay offset along the second axis is from about 1.05 to 2.5.

8. The semiconductor device of claim 3, wherein the overlay offset between the metal pillar and the metal via along the first axis is different from the overlay offset between the metal pillar and the metal via along the second axis.

9. The semiconductor device of claim 8, wherein a difference between the second overlay offset and the first overlay offset along the first axis is from about 1 to 20 μm.

10. The semiconductor device of claim 8, wherein a ratio of the second overlay offset to the first overlay offset along the first axis is from about 1.05 to 2.5.

11. The semiconductor device of claim 8, wherein a difference between the second overlay offset and the first overlay offset along the second axis is from about 1 to 20 μm.

12. The semiconductor device of claim 8, wherein a ratio of the second overlay offset to the first overlay offset along the second axis is from about 1.05 to 2.5.

13. The semiconductor device of claim 1, wherein the substrate is a semiconductor chip.

14. The semiconductor device of claim 1, wherein the substrate is a package substrate.

15. The semiconductor device of claim 1, wherein the metal pillar comprises a copper-containing pillar.

16. The semiconductor device of claim 1, wherein the metal pillar comprises a solder bump.

17. The semiconductor device of claim 1, wherein the metal pillar comprises substantially vertical sidewalls.

18. The semiconductor device of claim 1, wherein the metal pillar comprises tapered sidewalls.

19. A semiconductor device, comprising:
a substrate comprising a major surface; and
a plurality of metal bumps on the major surface, wherein each of the plurality of metal bumps comprises:
a metal via on the major surface, and
a metal pillar on the metal via, the metal pillar electrically connected to the metal via, each of the metal bumps of the plurality of metal bumps having an overlay offset between the metal pillar and the metal via, wherein the overlay offset is a distance between a centroid of the metal pillar and a centroid of the metal via,
wherein
the overlay offset of a first metal bump of the metal bumps is a first overlay offset,
the overlay offset of a second metal bump of the metal bumps is a second overlay offset,
the second metal bump is farther than the first metal bump to a centroid of the substrate,
the second overlay offset is greater than the first overlay offset, and
wherein a ratio of the second overlay offset to the first overlay offset ranges from about 1.05 to 2.5.

* * * * *